(12) United States Patent
Berry et al.

(10) Patent No.: US 8,872,534 B2
(45) Date of Patent: Oct. 28, 2014

(54) METHOD AND APPARATUS FOR TESTING DEVICES USING SERIALLY CONTROLLED INTELLIGENT SWITCHES

(75) Inventors: Tommie Edward Berry, Pleasanton, CA (US); Alistair Nicholas Sporck, Saratoga, CA (US)

(73) Assignee: FormFactor, Inc., Livermore, CA (US)

( * ) Notice: Subject to any disclaimer, the term of this patent is extended or adjusted under 35 U.S.C. 154(b) by 172 days.

(21) Appl. No.: 13/179,185

(22) Filed: Jul. 8, 2011

(65) Prior Publication Data

US 2011/0267085 A1    Nov. 3, 2011

Related U.S. Application Data

(62) Division of application No. 11/862,751, filed on Sep. 27, 2007, now Pat. No. 7,977,959.

(51) Int. Cl.
  *G01R 31/20* (2006.01)
  *G01R 1/073* (2006.01)

(52) U.S. Cl.
  CPC .................. *G01R 1/07342* (2013.01)
  USPC .................................... 324/754.07

(58) Field of Classification Search
  None
  See application file for complete search history.

(56) References Cited

U.S. PATENT DOCUMENTS

| | | | |
|---|---|---|---|
| 3,781,683 A | 12/1973 | Freed | |
| 3,827,820 A | 8/1974 | Hoffman | |
| 4,038,599 A | 7/1977 | Bove et al. | |
| 4,342,958 A * | 8/1982 | Russell | 324/754.07 |
| 4,455,654 A | 6/1984 | Bhaskar et al. | |
| 4,465,972 A | 8/1984 | Sokolich | |
| 4,468,616 A | 8/1984 | Yoshizaki | |
| 4,523,144 A | 6/1985 | Okubo et al. | |
| 4,706,018 A | 11/1987 | Beha et al. | |
| 4,719,411 A | 1/1988 | Buehler | |
| 4,780,670 A | 10/1988 | Cherry | |
| 4,837,622 A | 6/1989 | Whann et al. | |
| 4,899,099 A | 2/1990 | Mendenhall | |
| 5,070,297 A | 12/1991 | Kwon | |
| 5,090,118 A | 2/1992 | Kwon et al. | |
| 5,103,557 A | 4/1992 | Leedy | |
| 5,148,103 A | 9/1992 | Pasiecznik, Jr. | |
| 5,162,728 A | 11/1992 | Huppenthal | |
| 5,172,050 A | 12/1992 | Swapp | |
| 5,187,020 A | 2/1993 | Kwon et al. | |

(Continued)

FOREIGN PATENT DOCUMENTS

| | | |
|---|---|---|
| DE | 9004562 | 8/1990 |
| EP | 047141 | 3/1982 |

(Continued)

OTHER PUBLICATIONS

International Search Report and Written Opinion, Mar. 2, 2009, for PCT Application No. PCT/US2008/077586.

*Primary Examiner* — Paresh Patel
(74) *Attorney, Agent, or Firm* — Kirton McConkie

(57) ABSTRACT

Methods and apparatus for testing devices using serially controlled intelligent switches have been described. In some embodiments, a probe card assembly can be provided that includes a plurality of integrated circuits (ICs) serially coupled to form a chain, the chain coupled to at least one serial control line, the plurality of ICs including switches coupled to test probes, each of the switches being programmable responsive to a control signal on the at least one serial control line.

14 Claims, 4 Drawing Sheets

(56) References Cited

U.S. PATENT DOCUMENTS

| | | | |
|---|---|---|---|
| 5,191,708 | A | 3/1993 | Kasukabe et al. |
| 5,243,274 | A | 9/1993 | Kelsey et al. |
| 5,261,155 | A | 11/1993 | Angulas et al. |
| 5,323,107 | A | 6/1994 | D'Souza |
| 5,357,523 | A | 10/1994 | Bogholtz, Jr. et al. |
| 5,363,038 | A | 11/1994 | Love |
| 5,367,254 | A | 11/1994 | Faure et al. |
| 5,389,556 | A | 2/1995 | Rostoker et al. |
| 5,406,210 | A | 4/1995 | Pedder |
| 5,422,574 | A | 6/1995 | Kister |
| 5,434,513 | A | 7/1995 | Fujii et al. |
| 5,442,282 | A | 8/1995 | Rostoker et al. |
| 5,452,239 | A | 9/1995 | Dai et al. |
| 5,476,211 | A | 12/1995 | Khandros |
| 5,479,105 | A | 12/1995 | Kim et al. |
| 5,491,426 | A | 2/1996 | Small |
| 5,495,667 | A | 3/1996 | Farnworth et al. |
| 5,497,079 | A | 3/1996 | Yamada et al. |
| 5,521,870 | A | 5/1996 | Ishikawa |
| 5,532,610 | A | 7/1996 | Tsujide et al. |
| 5,534,784 | A | 7/1996 | Lum et al. |
| 5,541,505 | A | 7/1996 | Azumai |
| 5,568,054 | A | 10/1996 | Iino et al. |
| 5,570,032 | A | 10/1996 | Atkins et al. |
| 5,600,257 | A | 2/1997 | Leas et al. |
| 5,625,297 | A | 4/1997 | Arnaudov et al. |
| 5,642,054 | A | 6/1997 | Pasiecznik, Jr. |
| 5,648,661 | A | 7/1997 | Rostoker et al. |
| 5,669,774 | A | 9/1997 | Grabbe |
| 5,670,889 | A | 9/1997 | Okubo et al. |
| 5,686,842 | A | 11/1997 | Lee |
| 5,701,085 | A | 12/1997 | Malladi et al. |
| 5,701,666 | A | 12/1997 | DeHaven et al. |
| 5,736,850 | A | 4/1998 | Legal |
| 5,764,072 | A | 6/1998 | Kister |
| 5,772,451 | A | 6/1998 | Dozier, II et al. |
| 5,806,181 | A | 9/1998 | Khandros et al. |
| 5,821,763 | A | 10/1998 | Beaman et al. |
| 5,829,128 | A | 11/1998 | Eldridge et al. |
| 5,832,601 | A | 11/1998 | Eldridge et al. |
| 5,834,946 | A | 11/1998 | Albrow et al. |
| 5,838,163 | A | 11/1998 | Rostoker et al. |
| 5,864,946 | A | 2/1999 | Eldridge et al. |
| 5,878,486 | A | 3/1999 | Eldridge et al. |
| 5,884,398 | A | 3/1999 | Eldridge et al. |
| 5,897,326 | A | 4/1999 | Eldridge et al. |
| 5,900,738 | A | 5/1999 | Khandros et al. |
| 5,917,707 | A | 6/1999 | Khandros et al. |
| 5,974,662 | A | 11/1999 | Eldridge et al. |
| 5,983,493 | A | 11/1999 | Eldridge et al. |
| 5,998,228 | A | 12/1999 | Eldridge et al. |
| 6,032,356 | A | 3/2000 | Eldridge et al. |
| 6,059,982 | A | 5/2000 | Palagonia et al. |
| 6,064,213 | A | 5/2000 | Khandros et al. |
| 6,098,027 | A | 8/2000 | Yang |
| 6,110,823 | A | 8/2000 | Eldridge et al. |
| 6,133,744 | A | 10/2000 | Yojima et al. |
| 6,174,744 | B1 | 1/2001 | Watanabe et al. |
| 6,219,908 | B1 | 4/2001 | Farnworth et al. |
| 6,265,889 | B1 | 7/2001 | Tomita et al. |
| 6,275,051 | B1 | 8/2001 | Bachelder et al. |
| 6,316,988 | B1 | 11/2001 | Forehand et al. |
| 6,400,173 | B1 | 6/2002 | Shimizu et al. |
| 6,500,257 | B1 | 12/2002 | Wang et al. |
| 6,525,555 | B1 | 2/2003 | Khandros et al. |
| 6,535,555 | B1 | 3/2003 | Bordes et al. |
| 6,655,023 | B1 | 12/2003 | Eldridge et al. |
| 6,665,214 | B1 | 12/2003 | Cheah et al. |
| 6,788,091 | B1 | 9/2004 | Weber |
| 6,788,094 | B2 | 9/2004 | Khandros et al. |
| 6,856,150 | B2 | 2/2005 | Sporck et al. |
| 6,903,565 | B2 * | 6/2005 | Hartmann ............... 324/754.07 |
| 7,078,926 | B2 | 7/2006 | Khandros et al. |
| 7,116,119 | B2 | 10/2006 | Sporck et al. |
| 7,242,208 | B2 | 7/2007 | Ma et al. |
| 7,245,134 | B2 | 7/2007 | Granicher et al. |
| 7,307,433 | B2 | 12/2007 | Miller et al. |
| 7,330,023 | B2 * | 2/2008 | Schwindt et al. ....... 324/750.19 |
| 7,345,493 | B2 | 3/2008 | Khandros et al. |
| 7,555,366 | B2 * | 6/2009 | Kuivalainen et al. ......... 700/299 |
| 7,977,959 | B2 | 7/2011 | Berry et al. |
| 2003/0107394 | A1 | 6/2003 | Khandros et al. |
| 2004/0068869 | A1 | 4/2004 | Eldridge et al. |
| 2005/0093561 | A1 | 5/2005 | Watanabe et al. |
| 2006/0273809 | A1 | 12/2006 | Miller et al. |
| 2007/0013401 | A1 | 1/2007 | Khandros et al. |
| 2008/0231286 | A1 * | 9/2008 | Tsunekazu et al. .......... 324/509 |
| 2008/0303353 | A1 * | 12/2008 | Yu et al. ...................... 307/131 |

FOREIGN PATENT DOCUMENTS

| | | |
|---|---|---|
| EP | 699912 | 3/1996 |
| EP | 708338 | 4/1996 |
| FR | 2645679 | 10/1990 |
| JP | 02-159585 | 6/1990 |
| JP | 02-237047 | 9/1990 |
| JP | 06-180342 | 6/1994 |
| JP | 07-111283 | 4/1995 |
| JP | 08-37215 | 2/1996 |
| JP | 08-50162 | 2/1996 |
| JP | 8037215 | 2/1996 |
| JP | 08-129053 | 5/1996 |
| JP | 08-184612 | 7/1996 |
| JP | 2004-095802 | 3/2004 |
| JP | 2005-140555 | 6/2005 |
| JP | 2008304234 | 12/2008 |
| WO | WO 91-12706 | 8/1991 |
| WO | WO 95-14314 | 5/1995 |
| WO | WO 96-08056 | 3/1996 |
| WO | WO 96-15459 | 5/1996 |
| WO | WO 98-01906 | 1/1998 |
| WO | 2005/103740 | 11/2005 |
| WO | 2006/083856 | 8/2006 |

* cited by examiner

METHOD AND APPARATUS FOR TESTING DEVICES USING SERIALLY CONTROLLED INTELLIGENT SWITCHES

CROSS-REFERENCE TO RELATED APPLICATION(S)

This application is a division of U.S. patent application Ser. No. 11/862,751, filed Sep. 27, 2007 (now U.S. Pat. No. 7,977,959). The foregoing U.S. patent application Ser. No. 11/862,751 is incorporated herein by reference in its entirety.

BACKGROUND OF THE INVENTION

1. Field of the Invention

Embodiments of the present invention generally relate to wafer probe cards for testing semiconductor devices and, more specifically, to enhancing the performance of wafer probe cards.

2. Description of the Related Art

Testing is an important step in the production of semiconductor devices for use. Typically, partially or fully completed semiconductor devices are tested by bringing terminals disposed on an upper surface of a device to be tested—also referred to as a device under test (or DUT)—into contact with resilient contact elements, for example, as contained in a probe card assembly, as part of a test system. A test system controller with increased test channels can be a significant cost factor for a test system. Test system controllers have evolved to increase the number of channels and hence the number of devices that can be tested in parallel. Unfortunately, the number of DUTs per wafer has typically outpaced the development of test system controllers. Conventionally, available channels are typically inadequate for testing all DUTs on a wafer at the same time.

One technique to accommodate testing of components on a wafer with a limited number of test channels is to fan out a signal from a test system controller in the probe card assembly to multiple transmission lines. That is, a test signal normally provided to a single DUT can be fanned out to multiple DUTs in the probe card assembly. This technique can enable testing of an increased number of DUTs during a single touchdown for a fixed number of test system channels.

To better assure test integrity with fan out, increased circuitry can be provided on the probe card assembly to minimize the effect of a fault on one of the fan out lines (e.g., a short to ground through the DUT). A fault in a component connected on a fanned out line can severely attenuate a test signal for all DUTs on the fanned out test system channel. One solution involves the use of relays between the channel line branch points and probes to reduce attenuation caused by the faulty component. Each relay requires at least one separate line for controlling its state. A probe card assembly, however, may include several thousands of such branch points, requiring several thousands of relays. Including several thousands of control lines for controlling the relays on the probe card assembly is undesirable in terms of the required area and in terms of cost.

Accordingly, there exists a need in the art for a method and apparatus for testing semiconductor devices that attempts to overcome at least the aforementioned deficiencies.

SUMMARY OF THE INVENTION

Embodiments of the invention can relate to a probe card assembly. In some embodiments, a probe card assembly can include a plurality of integrated circuits (ICs) serially coupled to form a chain, the chain coupled to at least one serial control line, where the plurality of ICs includes switches coupled to test probes, each of the switches being programmable responsive to a control signal on the at least one serial control line.

Embodiments of the invention can relate to a test assembly. In some embodiments, a test assembly can include a printed wiring board including connectors for connecting to test instruments, and a serial control line providing at least one control signal; a probe head supporting test probes; and at least one integrated circuit (IC) coupled to the at least one serial control line, the at least one IC including switches coupled to at least a portion of the test probes, each of the switches being programmable responsive to the control signal transmitted as a sequential bit stream on the serial control line.

Embodiments of the invention can relate to a method of testing components on a wafer using a probe card assembly. In some embodiments, a method of testing components on a wafer using a probe card assembly can include serially shifting a control signal through a chain comprising a plurality of integrated circuits (ICs) including a plurality of switches, the plurality of switches being programmed responsive to the control signal; and communicating test signals between test probes and test instruments through the plurality of switches to test the components.

BRIEF DESCRIPTION OF THE DRAWINGS

So that the manner in which the above recited features of the various embodiments of the present invention can be understood in detail, a more particular description of the invention, briefly summarized above and others described below, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Where possible, identical reference numerals are used herein to designate identical elements that are common to the figures. The images used in the drawings are simplified for illustrative purposes and are not necessarily depicted to scale.

DETAILED DESCRIPTION

The present invention provides methods and apparatus for testing devices using serially controlled intelligent switches. The intelligent switches may be included in ICs, which are coupled to form a serial chain of ICs. Each of the intelligent switches may be independently controlled using a serial interface to the chain of ICs. Thus, a single serial control line may be used to control a multiplicity of intelligent switches. By serial, it is meant that signals on a serial control line may be transmitted as a sequential bit stream (i.e., transmitted bit-by-bit). The intelligent switches may be used to fan out test resources on a probe card assembly configured to test a plurality of devices. The use of a single control line for a given chain of ICs substantially reduces the number of control lines required on a probe card assembly. These and other aspects and embodiments of the invention are described in detail below.

Figure 1:
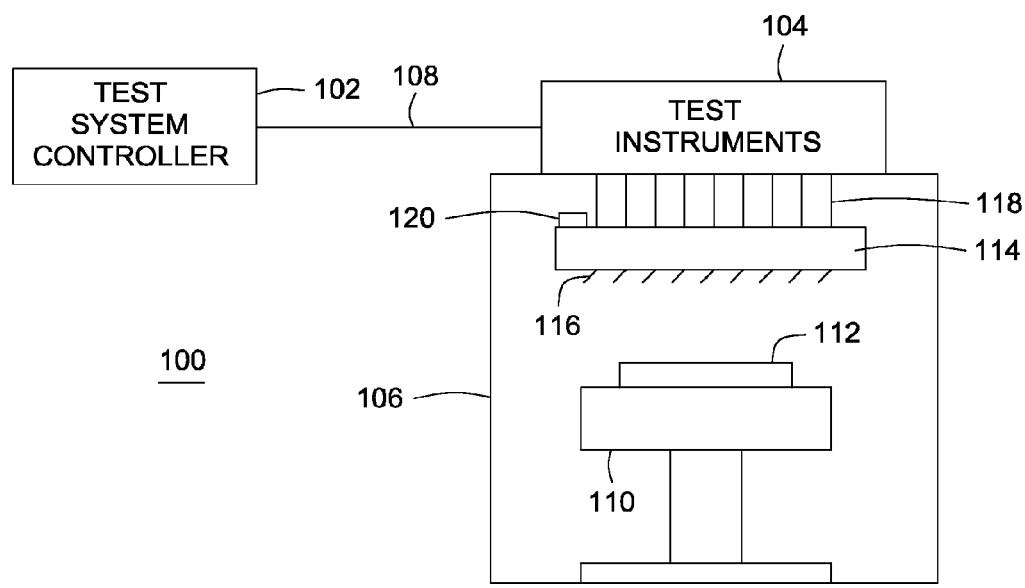
FIG. 1 is a block diagram depicting a test system according to some embodiments of the invention.

FIG. 1 is a block diagram depicting a test system 100 according to some embodiments of the invention. The test system 100 can generally include a test system controller 102, test instruments 104, and a prober 106. The test system controller 102 can be coupled to the test instruments 104 by a communication link 108. The prober 106 can include a stage 110 for mounting a device under test (DUT) 112 being tested and a probe card assembly 114. The DUT 112 can be any electronic device or devices to be tested. Non-limiting examples of a suitable DUT include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. The term DUT, as used herein, can refer to one or a plurality of such electronic devices. The probe card assembly 114 can include probes 116 (also referred to as test probes) that contact the DUT 112. The stage 110 can be movable to contact the DUT 112 with probes 116.

In the test system 100, test data can be generated by the test instruments 104 and transmitted through the probe card assembly 114, the probes 116, and ultimately to the DUT 112. The generation of the test data may be controlled by the test system controller 102 (e.g., a general purpose computer). Test results can then provided from the DUT 112 back through the probe card assembly 114 to the test instruments 104. The test instruments 104 may transmit the test results to the test system controller 102 for analysis.

Test data provided from the test instruments 104 can be divided into individual test channels. The test channels can be linked by connectors 118 to the probe card assembly 114. The connectors 118 may be any suitable connectors, such as flexible cable connectors, pogo pins, zero insertion force (ZIF) connectors, or the like. The probe card assembly 114 can fan out each of the test channels to multiple probes 116. The probe card assembly 114 can include electronics 120 for enabling the fan outs and for isolating faults on the fan out lines. In some embodiments, the electronics 120 can include a plurality of intelligent switches. Groups of the intelligent switches may be implemented using integrated circuits (ICs). The intelligent switches can be controllable using one or more serial control lines. Aspects of the intelligent switches are described below.

Figure 2:
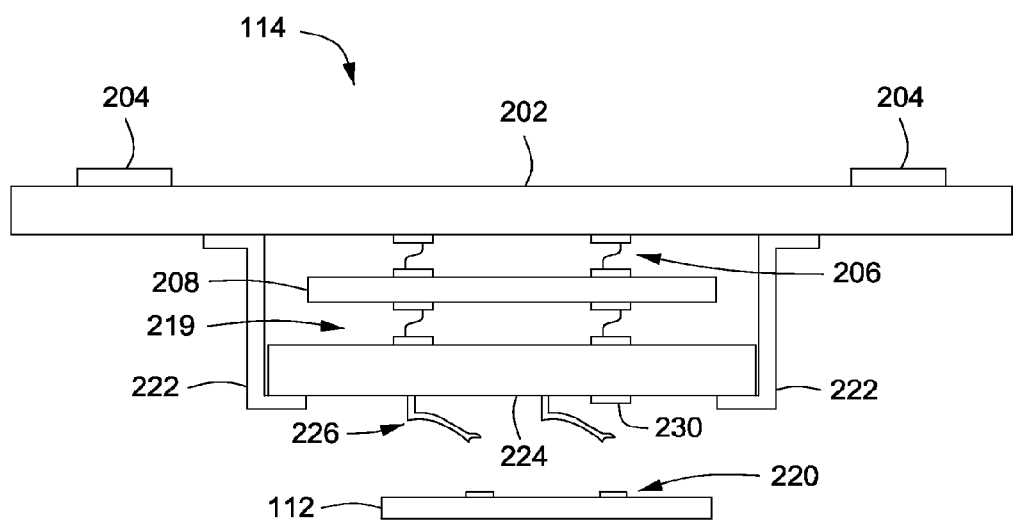
FIG. 2 depicts the probe card assembly according to some embodiments of the invention.

FIG. 2 depicts the probe card assembly 114 according to some embodiments of the invention. The probe card assembly 114 generally acts as an interface between the test instruments 104 and the DUT 112. The probe card assembly 114 can include electrical connectors 204 configured to make electrical connections with a plurality of test channels (not shown) from the test instruments 104. The probe card assembly 114 can also include one or more resilient contact elements 226 as test probes. The resilient contact elements 226 can be configured to be pressed against, and thus make temporary electrical connections with, one or more input and/or output terminals 220 of the DUT 112. The resilient contact elements 226 are typically configured to correspond to desired terminals 220 of the DUT 112 and may be arranged in one or more arrays having a desired geometry.

The probe card assembly 114 may include one or more substrates configured to support the connectors 204 and the resilient contact elements 226 and to provide electrical connections therebetween. The exemplary probe card assembly 114 shown in FIG. 2 has three such substrates, although in other implementations, the probe card assembly 114 can have more or fewer substrates. In the embodiment depicted in FIG. 2, the probe card assembly 114 includes a wiring substrate 202 (also referred to as a printed wiring board), an interposer substrate 208, and a probe substrate 224 (also referred to as a probe head). The wiring substrate 202, the interposer substrate 208, and the probe substrate 224 can generally be made of any type of suitable material or materials, such as, without limitation, printed circuit boards, ceramics, organic or inorganic materials, and the like, or combinations thereof.

Additionally, the probe card assembly 114 may include one or more active or passive electronic components (such as capacitors, resistors, and the like). In some embodiments, intelligent switches 230 can be disposed on the wiring substrate 202. In other embodiments, the intelligent switches 230 may be disposed on the interposer 408. In still other embodiments, the intelligent switches 230 may be disposed on the probe substrate 224 along with the resilient contact elements 226. In other embodiments, the intelligent switches 230 can be disposed on any combination of one or more of the wiring substrate 202, the interposer substrate 208, and the probe substrate 224.

Electrically conductive paths (not shown) are typically provided from the connectors 204 through the various substrates and the intelligent switches 230 to the resilient contact elements 226. For example, in the embodiment depicted in FIG. 2, electrically conductive paths (not shown) may be provided from the connectors 204 through the wiring substrate 202 to a plurality of electrically conductive spring interconnect structures 206. Other electrically conductive paths (not shown) may be provided from the spring interconnect structures 206 through the interposer substrate 208 to a plurality of electrically conductive spring interconnect structures 219. Still other electrically conductive paths (not shown) may further be provided from the spring interconnect structures 219 through the probe substrate 224 to the resilient contact elements 226. The electrically conductive paths through the wiring substrate 202, the interposer substrate 208, and the probe substrate 224 can comprise electrically conductive vias, traces, or the like, that may be disposed on, within, and/or through the wiring substrate 202, the interposer substrate 208, and the probe substrate 224. The intelligent switches 230 can be provided on one or more of the wiring substrate 202, the interposer substrate 208, and/or the probe substrate 224 in the path of at least some of the aforementioned electrically conductive paths to enable fan out thereof, as well as isolation of the fanned out lines from failures on the DUT 112.

The wiring substrate 202, the interposer substrate 208, and the probe substrate 224 may be held together by one or more brackets 222 and/or other suitable means (such as by bolts, screws, or other suitable fasteners). The configuration of the probe card assembly 114 shown in FIG. 2 is exemplary only and is simplified for ease of illustration and discussion and many variations, modifications, and additions are contemplated. For example, a probe card assembly may have fewer or more substrates (e.g., 202, 208, 224) than the probe card assembly 114 shown in FIG. 2. As another example, a probe card assembly may have more than one probe substrate (e.g., 224), and each such probe substrate may be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. No. 5,974,662, issued Nov. 2, 1999 and U.S. Pat. No. 6,509,751, issued Jan. 21, 2003, as well as in the aforementioned U.S. patent application Ser. No. 11/165,833. It is contemplated that various features of the probe card assemblies described in those patents and may be implemented in the probe card assembly 114 shown in FIG. 2 and that the probe card assemblies described in the aforementioned patents and may benefit from the use of the inventive intelligent switches and their configurations described herein.

Figure 3:
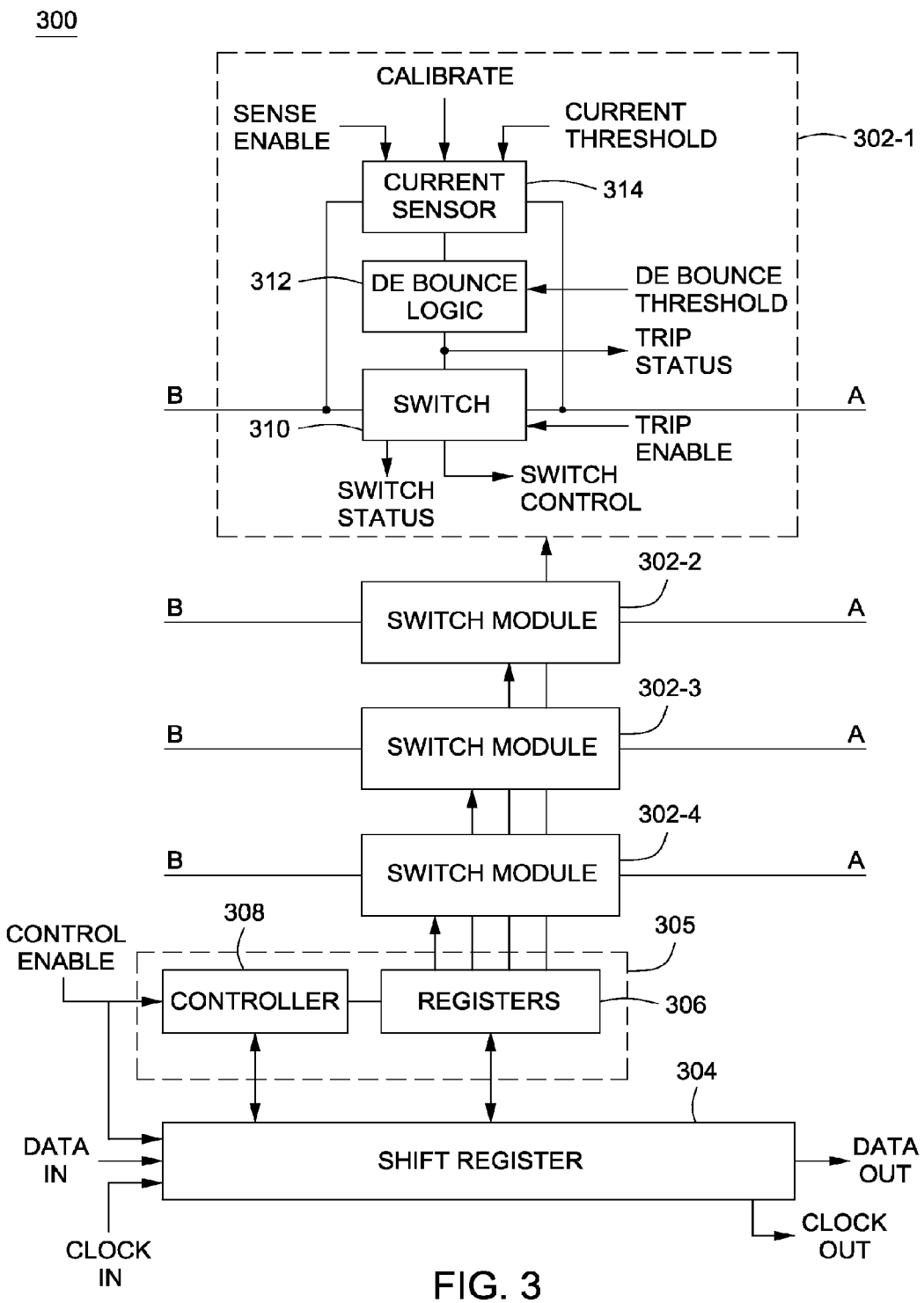
FIG. 3 is a schematic diagram depicting an IC configured to provide serial controlled intelligent switching according to embodiments of the invention.

FIG. 3 is a schematic diagram depicting an IC 300 configured to provide serial controlled intelligent switching according to some embodiments of the invention. The IC 300 can include intelligent switches 302-1 through 302-4 (collectively referred to as intelligent switches 302), a shift register 304, and control logic 305. In the present example, the control logic 305 can include registers 306 and controller 308. Each of the intelligent switches 302 can include a switch circuit 310, debounce logic 312, and a current sensor 314. The switch circuit 310, the debounce logic 312, and the current sensor 314 may include various types of circuits and logic components, such as transistors, logic gates, flip-flops, comparators, operational amplifiers, and the like to provide, at least, the functionality described herein. For purposes of clarity by example, only the intelligent switch 302-1 is shown in detail. It is to be understood that each of the intelligent switches 302-2 through 302-4 may be configured identically to the intelligent switch 302-1. In addition, although only four intelligent switches are shown, the IC 300 may generally include more or less than four.

Each of the intelligent switches 302 includes two terminals, designated 'A' (first terminal) and 'B' (second terminal). Each of the intelligent switches 302 may also include a control terminal, as discussed below. In the illustrated embodiment, the switch circuit 310 can include a single pole, single throw (SPST) switch. In the closed state, terminal A is connected to terminal B and current can flow through the switch circuit 310. In the open state, little or no current flows between terminal A and terminal B. As described below, one terminal of the switch circuit 310 may be coupled to a test resource and the other terminal of the switch circuit 310 may be coupled to a test probe on a probe card assembly. Although the switch circuit 310 is described as an SPST switch, those skilled in the art will appreciate that the switch circuit 310 may generally have one or more poles and one or more throws, along with the corresponding number of terminals to be switched.

The current sensor 314 can be configured to measure current flowing through the switch circuit 310 and asserts a signal if the measured current exceeds a threshold value (e.g., the current sensor 314 detects an overcurrent condition). The current sensor can be coupled to each of terminal A and terminal B. The current sensor 314 can be programmed with a current threshold from the control logic 305. Accordingly, each of the intelligent switches 302 may be configured to open responsive to a programmable current level. The current sensor 314 may also receive a calibration signal from the control logic 305 that can be used to calibrate the current sensor 314. The current sensor 314 may be calibrated using well-known techniques. The current sensor 314 may further receive a sense enable signal from the control logic 305. The sense enable signal can be used to enable or disable current sensing by the current sensor 314.

The current sensor 314 can drive the debounce logic 312 via an output terminal. The debounce logic 312 enables qualification of the overcurrent condition in the time domain. That is, the debounce logic 312 reports the overcurrent condition only after the current sensor 314 detects overcurrent for a threshold time period (referred to as "debounce" time). If the overcurrent condition exists for the debounce time period, the debounce logic 312 can cause the switch circuit 310 to open. Accordingly, each of the intelligent switches 302 may be configured to open responsive to a programmable current level existing for a programmable debounce period. The debounce logic 312 may be programmed with a debounce threshold from the control logic 305. The output of the debounce logic 312 can indicate whether the switch circuit 310 is tripped (opened) due to an overcurrent condition existing for the debounce time period and thus provides a "trip status." The trip status signal may be provided to the control logic 305. The debounce logic can be coupled between a control terminal of the switch circuit and the output terminal of the current sensor.

The switch circuit 310 can also configured to be open or closed based on a switch control signal. The switch control signal may be received from the control logic 305. The switch circuit 310 may report its open or closed status. The switch status may be provided to the control logic 305. The switch circuit 310 may also receive a trip enable signal from the control logic 305. The trip enable signal can be used to enable or disable the trip capability of the switch circuit 310 in response to an overcurrent indication by the debounce logic 312.

The intelligent switches 302 can be programmed by serially shifting a control word into the shift register 304. Control bits at the "data in" terminal can be shifted into the shift register 304 in accordance with a clock signal at the "clock in" terminal, for example. Bits at the end of the shift register 304 can be shifted out at the "data out" terminal. The clock signal can be provided at the "clock out" terminal. As described below, the data out terminal and the clock out terminal of the shift register 304 may be coupled to data in and clock in terminals, respectively, of a shift register 304 in another IC to form part of a serial chain of ICs. The bits in the control word can control operation of the IC 300.

Figure 4:
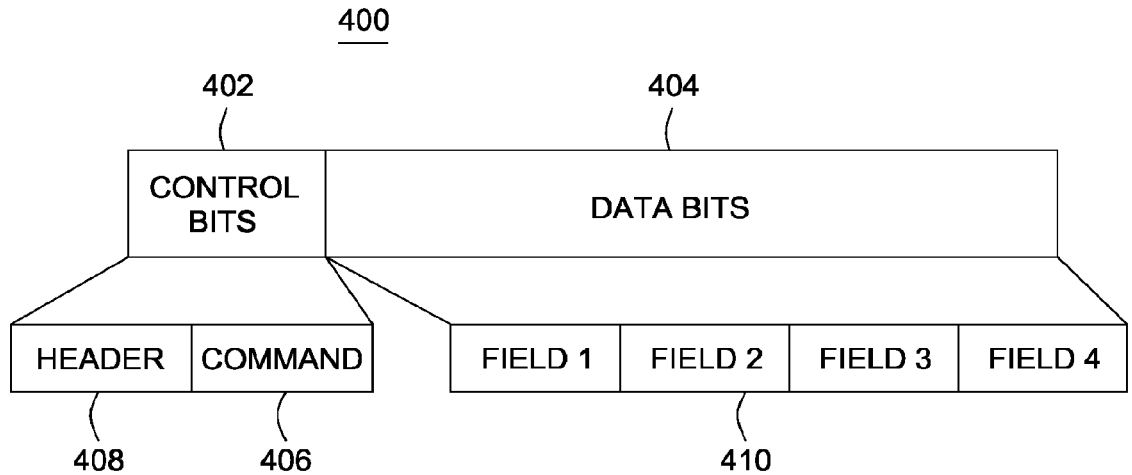
FIG. 4 is a block diagram depicting a control word according to embodiments of the invention.

FIG. 4 is a block diagram depicting a control word 400 according to some embodiments of the invention. The control word 400 can include control bits 402 and, in some embodiments, data bits 404. The control bits 402 can be processed by the controller 308. The controller 308 may obtain or otherwise analyze the control bits 402 in response to a control enable signal. In some embodiments, the control bits 402 can include a command 406 and, in some embodiments, a header 408. The command 406 can determine how the registers 306 will be utilized. The data bits 404 can be processed by the registers 306. The controller 308, responsive to the command 406, may cause the data bits 404 to be loaded into the registers 306 from the shift register 304. In some embodiments, the controller 308, responsive to the command 406, may cause the data bits 404 to be loaded into the shift register 304 from the registers 306 (e.g., in case of readback). In yet other embodiments, the controller 308 may cause some of the data bits 404 to be loaded into the registers 306 from the shift register 304, and other of the data bits 404 to be loaded into the shift register 304 from the registers 306. In some embodiments, the data bits 404 can include fields 410 corresponding to the intelligent switches 302. In the present example, the data bits 404 can include fields 410-1 through 410-4 corresponding to the intelligent switches 302-1 through 302-4, respectively.

In some embodiments, the command 406 may include an instruction to set a debounce period for each of the intelligent switches 302. For example, in embodiments where the data bits 404 includes fields 410 corresponding to the switches 302, each of the fields 410 may include a value that controls the debounce period for a respective one of the intelligent switches 302. In some embodiments, the command 406 may include an instruction to set a current threshold for each of the intelligent switches 302. For example, in embodiments where the data bits 404 includes fields 410 corresponding to the switches 302, each of the fields 410 may include a value that controls the current threshold (sets the current trip) for a respective one of the intelligent switches 302. In some embodiments, the command 406 may include an instruction to control the state of the intelligent switches 302, as well as retrieve state information from the intelligent switches 302. For example, in embodiments where the data bits 404 includes fields 410 corresponding to the switches 302, each of the fields 410 may include one or more values that control one or more states in a respective one of the intelligent switches 302, such as an on/off state of the switch circuit 310, sense enable, and trip enable. In addition, each of the fields 410 may include one or more writable bits configured to convey one or more status values in a respective one of the intelligent switches 302, such as switch status (on or off) and/or trip status (tripped or not tripped). In some embodiments, the command may include an instruction to calibrate the current sensor 314 in each of the intelligent switches 302. Although the command 406 has been described as having a field per switch by way of example, it is to be understood that the command may have less fields than switches. In such cases, a field may apply to more than one of the switches.

The transfer of data between the shift register 304 and the control logic 305 may occur according to the control enable signal. For example, if the control enable signal is asserted, the data transfer occurs. The control enable signal may be applied to each of the ICs in a chain such that data transfer occurs in each of the ICs. Once transfer is complete, the control enable signal may be de-asserted. At such time, bits in the shift register 304 may be shifted out the "data out" terminal in accordance with a clock signal at the "clock in" terminal. The bits may be shifted out in each of the ICs in a chain in accordance with the clock signal. The clock signal is provided at the "clock out" terminal. In this manner, data associated with the intelligent switches 302 (as well as other intelligent switches in other ICs of the chain), such as trip status and/or switch status, may be read back via serial stream from the shift register 304.

Figure 5:
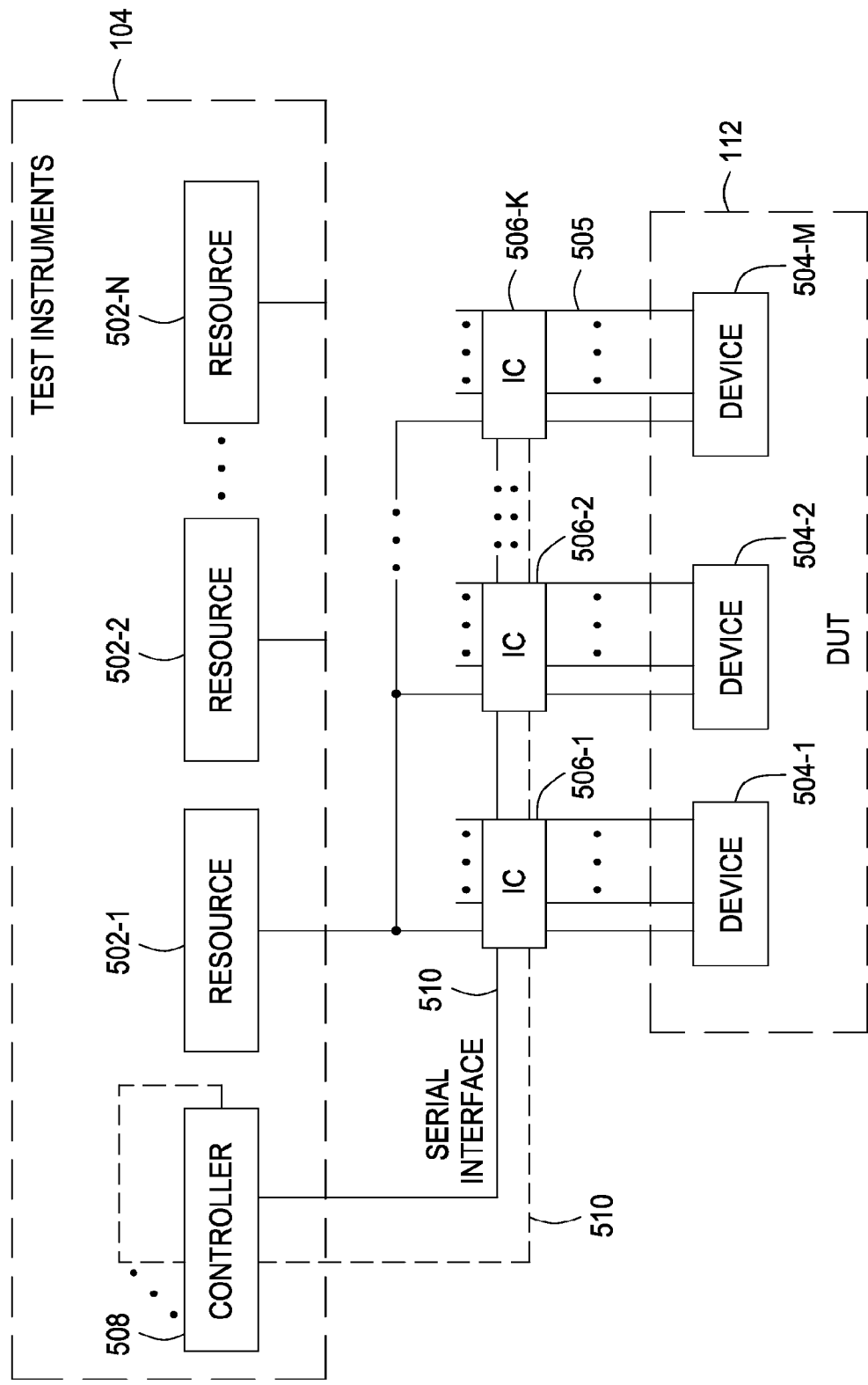
FIG. 5 is a circuit diagram depicting components on the probe card assembly according to embodiments of the invention.

FIG. 5 is a circuit diagram depicting components on a probe card assembly 114 according to some embodiments of the invention. The test instruments 104 can generally include a plurality of test resources (generally referred to as resources) and at least one controller 508. The resources may include any combination of voltage supply resources that supply voltage to the DUT 112, digital resources that supply digital signals to the DUT 112, and/or analog resources that supply analog signals to the DUT 112. An exemplary set of resources 502-1 through 502-N (generally referred to as resources 502) is shown in FIG. 5, where N is an integer greater than one. In the example shown in FIG. 5, the DUT 112 includes a set of devices 504-1 through 504-M (generally referred to as devices 504), where M is an integer greater than one. That is, the DUT 112 includes multiple test sites (devices to be tested).

The resources 502 can be associated with the devices 504 through ICs 506-1 through 506-K (generally referred to as ICs 506), where K is an integer greater than zero. Each of the ICs 506 may be implemented similar to the IC 300 described above. That is, each of the ICs 506 may include a plurality of intelligent switches that are programmable by serially loading a control word into a shift register, as described above. In the present example, the resource 502-1 is shown coupled to an intelligent switch in each of the ICs 506. Others of the resources 502 may be coupled to other intelligent switches in the ICs 506 in a similar manner (such connections are omitted for clarity). The intelligent switches in the ICs 506 can be in communication with the devices 504 through temporary pressure connections 505. The temporary pressure connections may be effected using test probes, as described above. At least one of the intelligent switches in an IC 506 may switch a test signal applied to one of the test probes by the test instruments (e.g., of test signal to a DUT). At least one of the intelligent switches in an IC 506 may switch a test signal applied to the test instruments by one of the test probes (e.g., read back of test signal from a DUT).

In the present example, the intelligent switches in the IC 506-1 can be in communication with to the device 504-1, the intelligent switches in the IC 506-2 can be in communication with to the device 504-2, and so on. In this manner, the resource 502-1 can be distributed among the devices 504. If any one of the devices 504 draws too much current (i.e., a current greater than a threshold current), the corresponding intelligent switch in the corresponding one of the ICs 506 can be set to trip and thus isolate the device from the resource 502-1. The other devices can continue to receive the resource output without operational effect. The configuration of resources, ICs, and devices shown in FIG. 5 is merely exemplary. In other configurations, a resource may be coupled to more than one terminal of an IC (i.e., more than one intelligent switch in an IC). Likewise, an IC may be coupled to more than one device (i.e., more than one intelligent switch in an IC may drive a single device). There may be more or less resources than ICs, and there may be more or less ICs than devices.

The ICs 506 can form a serial chain of ICs. The controller 508 can be coupled to a serial input of the IC 506-1 through a serial interface 510. A serial output of the IC 506-1 can be coupled to a serial input of the IC 506-2, a serial output of the IC 506-2 cab be coupled to a serial input of the IC 506-3, and so on to form the serial chain. The controller 508 can drive the chain of ICs with a control signal that loads a control word into each of the ICs 506. As described above, for a given IC, the control word can control operation of the IC. For example, the controller 508 may produce a control signal to set the current threshold for the intelligent switches in each of the ICs 506. The controller 508 may produce a control signal to set the debounce period for the intelligent switches in each of the ICs 506. The controller 508 may produce a control signal to set the state of each intelligent switch in the ICs 506. The controller may read back the control signal from the chain of ICs 506 to capture state information. Thus, a single control line can be used to control distribution and isolation of the resources 502 among the devices 504 in the DUT 112. Use of the single control line can substantially reduce the number of routing resources need on the probe card assembly to control such distribution and isolation of the resources 502. This in turn reduces the cost to manufacture the probe card assembly.

In the present example, a single chain of ICs 506 is provided. In some embodiments, multiple chains of ICs may be provided. In such embodiments, the controller 508 may include a plurality of serial interfaces 510 for serially controlling a plurality of IC chains 506. In other embodiments, the test instruments 104 may include multiple controllers for driving multiple chains of ICs. In other embodiments, one or more controllers 508 may provide multiple serial interfaces 510 to the IC chain 506. That is, the IC chain 506 may receive and propagate a plurality of serial control signals. Each serial control signal may control a group of one or more intelligent switches in each of the ICs 506.

Figure 6:
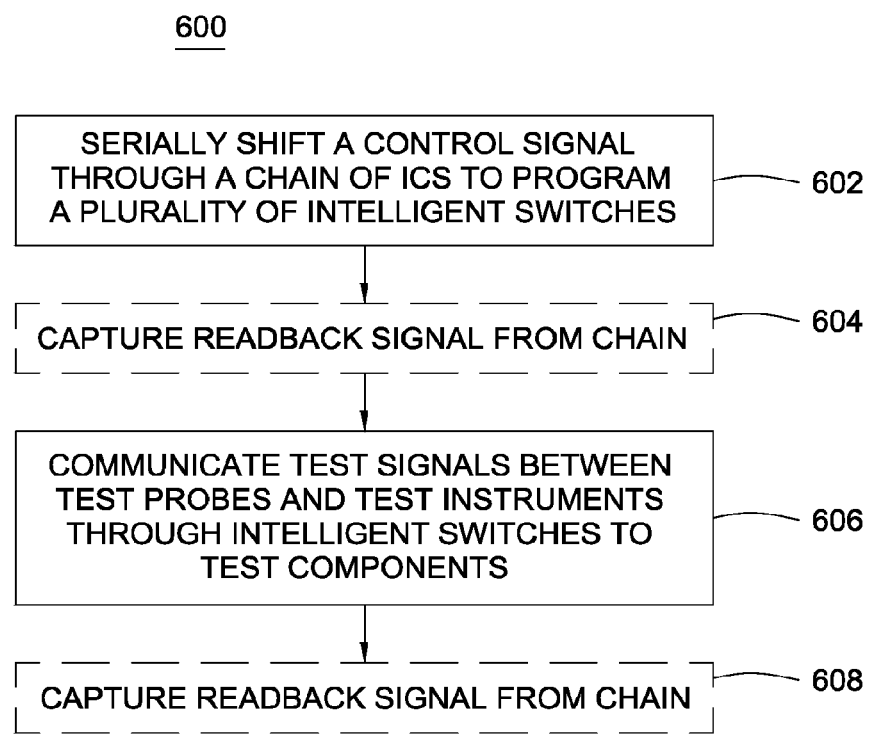
FIG. 6 is a flow diagram depicting a method of testing components on a wafer using a probe card assembly according to embodiments of the invention.

FIG. 6 is a flow diagram depicting a process 600 of testing components on a wafer using a probe card assembly according to some embodiments of the invention. In the process 600, a control signal is serially shifted through a chain of ICs (plurality of ICs) to program a plurality of intelligent switches (block 602). The control signal may be shifted through the chain in one or more iterations to perform one or more operations. In some embodiments, bits of the control signal (first bits) can be loaded into a shift register in each of the ICs to selective enable a programmable current trip and a current sensing capability for each of the plurality of intelligent switches. In some embodiments, bits of the control signal (second bits) can be loaded into the shift register in each of the ICs to program a current threshold of the programmable current trip for each of the intelligent switches. In some embodiments, bits of the control signal (third bits) can be loaded into the shift register of each of the ICs to program a debounce time of the programmable current trip for each of the intelligent switches. In some embodiments, bits of the control signal (fourth bits) can be loaded into the shift register of each of the ICs to cause calibration of the current sensing capability of the intelligent switches. In some embodiments, a combination of the aforementioned operations can be performed at block 602.

In some embodiments, a readback signal may be captured from the chain of ICs (block 604). The readback signal may include bits (fifth bits) indicative of status of the intelligent switches in the ICs. As described above, the readback signal may be captured by shifting bits out of the shift register in each of the ICs. Test signals may be communicated between test probes and test instruments through the intelligent switches to test the components (block 606). In some embodiments, a readback signal may be captured from the chain of ICs (block 608). The readback signal may include bits indicative of status of the intelligent switches in the ICs subsequent to testing of the components. This can provide an indication of which of the intelligent switches may having tripped due to an overcurrent condition, and thus an indication of which of the components being tested may be faulty. Thus, the readback signal can enable localization of faults among the components being tested.

Thus, methods and apparatus for testing devices using serially controlled intelligent switches have been described. The intelligent switches may be included in ICs, which are coupled to form a serial chain of ICs. Each of the intelligent switches may be independently controlled using a serial interface to the chain of ICs. Hence, a single serial control line may be used to control a multiplicity of intelligent switches. The intelligent switches may be used to fan out test resources on a probe card assembly configured to test a plurality of devices. The use of a single control line for a given chain of ICs substantially reduces the number of control lines required on a probe card assembly. Each of the intelligent switches may have a programmable current trip capability. Switch-by-switch current limit thresholds can be used to prevent damage to devices under test and to test resources. Data produced by the intelligent switches may be read back from the chain of ICs over the serial interface. This switch-by-switch readback capability can assist in the process of fault isolation among the devices under test.

While the foregoing is directed to embodiments of the present invention, other and further embodiments of the invention may be devised without departing from the basic scope thereof, and the scope thereof is determined by the claims that follow.

The invention claimed is:

1. A probe card assembly comprising:
a connector configured to connect to and receive voltage, analog signals, or digital signals from a test resource;
probes configured to contact and thereby make pressure electrical connections with a device under test; and
an electric circuit comprising:
input terminals connected to said connector,
output terminals connected to said probes,
intelligent switch modules, each said intelligent switch module comprising a switch that connects one of said input terminals to one of said output terminals and a current sensor configured to sense current flowing through said switch while said switch is closed, wherein said intelligent switch module is configured to open said switch when said current exceeds a programmed threshold current, and
control logic configured to selectively program said threshold current for each of said intelligent switch modules;
wherein each of said intelligent switch modules further comprises debounce logic configured to cause said intelligent switch module to open said switch when said current exceeds said programmed threshold current for a programmed threshold time period.

2. The probe card assembly of claim 1, wherein said control logic is further configured to selectively program said threshold time period for each of said intelligent switch modules.

3. The probe card assembly of claim 2, wherein said electric circuit further comprises a serial shift register connected to said control logic, said shift register comprising a serial input connected to said connector, a serial output, and a clock input configured to clock a control word serially into said shift register through said serial input, serially through said shift register, and serially out of said shift register through said serial output.

4. The probe card assembly of claim 3, wherein said control logic comprises a controller connected to said shift register and data registers connected to said shift registers and said intelligent switch modules.

5. The probe card assembly of claim 4, wherein:
parallel connections connect said controller to said shift register, and
parallel connections connect said data registers to said shift register.

6. The probe card assembly of claim 4, wherein said control logic is configured to:
in response to said control word in said shift register comprising a load command, load data bits of said control word from said shift register into said data registers, and
in response to said control word in said shift register comprising a read command, read data bits from said data registers into said shift register.

7. The probe card assembly of claim 4, wherein said control logic is configured to:
in response to said control word in said shift register comprising a program threshold current command, program said threshold for each of said intelligent switch modules in accordance with data bits in said control word, and
in response to said control word in said shift register comprising a program threshold time period command, program said threshold time period for each of said intelligent switch modules in accordance with data bits in said control word.

8. The probe card assembly of claim 4, wherein said control logic is configured to, in response to said control word in said shift register comprising a calibrate command, calibrate said current sensor of each of said intelligent switch modules.

9. The probe card assembly of claim 1, wherein said electric circuit is a first electric circuit further comprising a serial shift register connected to said control logic, said shift register comprising a serial input connected to said connector, a serial output, and a clock input configured to clock a control word serially into said shift register through said serial input, serially through said shift register, and serially out of said shift register through said serial output.

10. A probe card assembly comprising:
a connector configured to connect to and receive voltage, analog signals, or digital signals from a test resource;
probes configured to contact and thereby make pressure electrical connections with a device under test; and
an electric circuit comprising:
input terminals connected to said connector,
output terminals connected to said probes,
intelligent switch modules, each said intelligent switch module comprising a switch that connects one of said input terminals to one of said output terminals and a current sensor configured to sense current flowing through said switch while said switch is closed, wherein said intelligent switch module is configured to open said switch when said current exceeds a programmed threshold current, and
control logic configured to selectively program said threshold current for each of said intelligent switch modules
wherein said electric circuit is a first electric circuit further comprising a serial shift register connected to said control logic, said shift register comprising a serial input connected to said connector, a serial output, and a clock input configured to clock a control word serially into said shift register through said serial input, serially through said shift register, and serially out of said shift register through said serial output.

11. The probe card assembly of claim 10, wherein:
parallel connections connect said controller of said first electric circuit to said shift register of said first electric circuit,
parallel connections connect said data registers of said first electric circuit to said shift register of said first electric circuit,
parallel connections connect said controller of said second electric circuit to said shift register of said second electric circuit, and
parallel connections connect said data registers of said second electric circuit to said shift register of said second electric circuit.

12. The probe card assembly of claim 10, wherein:
said first electric circuit is a first integrated circuit device, and
said second electric circuit is a second integrated circuit device that is structurally separate and distinct from said first integrated circuit device.

13. The probe card assembly of claim 12, wherein:
said serial output of said first electric circuit is connected to said serial input of said second electric circuit, and
said clock output of said first electric circuit is connected to said clock input of said second electric circuit.

14. The probe card assembly of claim 1, wherein said electric circuit is an integrated circuit device.

* * * * *